United States Patent [19]
Sandhu et al.

[11] Patent Number: 6,110,820
[45] Date of Patent: *Aug. 29, 2000

[54] LOW SCRATCH DENSITY CHEMICAL MECHANICAL PLANARIZATION PROCESS

[75] Inventors: Gurtej S. Sandhu; Sujit Sharan, both of Boise, Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/874,779

[22] Filed: Jun. 13, 1997

Related U.S. Application Data

[63] Continuation of application No. 08/474,311, Jun. 7, 1995, abandoned.

[51] Int. Cl.$^7$ .................................................. H01L 21/304
[52] U.S. Cl. ........................... 438/633; 438/692; 438/697
[58] Field of Search .................................. 438/633, 692, 438/697; 451/41

[56] References Cited

U.S. PATENT DOCUMENTS

| | | | |
|---|---|---|---|
| 3,841,031 | 10/1974 | Walsh .......................................... | 51/283 |
| 4,070,797 | 1/1978 | Griesshammer et al. ................. | 51/326 |
| 4,184,908 | 1/1980 | Lackner et al. .......................... | 156/636 |
| 4,193,226 | 3/1980 | Gill, Jr. et al. .............................. | 51/124 |
| 4,680,893 | 7/1987 | Cronkhite et al. ........................ | 51/5 R |
| 4,811,522 | 3/1989 | Gill, Jr. ................................... | 51/131.1 |
| 4,968,381 | 11/1990 | Prigge et al. ............................ | 156/636 |
| 5,096,854 | 3/1992 | Saito et al. ............................... | 437/225 |
| 5,142,828 | 9/1992 | Curry, II ................................ | 51/281 R |
| 5,244,534 | 9/1993 | Yu et al. .................................. | 156/636 |
| 5,320,706 | 6/1994 | Blackwell ................................ | 156/636 |
| 5,328,553 | 7/1994 | Poon ........................................ | 156/636 |
| 5,395,801 | 3/1995 | Doan et al. ............................... | 437/225 |
| 5,429,711 | 7/1995 | Watanabe et al. ........................ | 216/52 |
| 5,449,314 | 9/1995 | Meike et al. .............................. | 451/41 |
| 5,491,113 | 2/1996 | Marota .................................... | 437/225 |
| 5,502,007 | 3/1996 | Maruse .................................... | 437/225 |
| 5,514,245 | 5/1996 | Doan et al. ........................... | 156/636.1 |

FOREIGN PATENT DOCUMENTS

| | | | |
|---|---|---|---|
| 0 226 931 | 7/1987 | European Pat. Off. .................. | 21/302 |
| 2-34925 | 2/1990 | Japan ........................... | H01L 21/306 |

OTHER PUBLICATIONS

Wolf, Stanley, "Silicon Processing for the VLSI Era", vol. 1, pp. 23–25.
Vincent Y. Pickhardt et al., "Chemomechanical Polishing of CdS," J. Electrochem. Soc.: Solid–State Science and Technology, Aug. 1974.
T. Katada et al., "Hall Effect, Schottky Barrier Capacitance, and Photoluminescence Spectra Measurements for GaAs Epitaxial Layer and Their Correlation," Dept. of Electrical Engineering, The University of Tokyo, Japan.
Rodel, "Polishing with napped poromerics: an overview," Surfacetech Review, vol. 1, Issue 1, Dec. 1986.
Rodel, "A "Sound"Reason for a Precesion Surface," Surfacetech Review, vol. 1, Issue 6, May 1989.
W.L.C.M. Heyboer et al., "Chemomechanical Silicon Polishing," J. Electrochem. Soc., vol. 138, No. 3, Mar. 1991.
William J. Patrick et al., "Application of Chemical Mechanical Polishing to the Fabrication of VLSI Circuit Interconnections," SP 04474, J. Electrochem. Soc., vol. 138, No. 6, Jun. 1991.
C. Yu et al., "Submicron Aluminum Plug Process Utilizing High Temperature Sputtering and Chemical Mechanical Polishing," Conference Proceedings ULSI–VII, 1992.

*Primary Examiner*—Charles Bowers
*Assistant Examiner*—Matthew Whipple
*Attorney, Agent, or Firm*—Fletcher, Yoder & Van Someren

[57] ABSTRACT

A CMP process using two or more stages wherein each stage has a different polishing rate. The CMP process is characterized by a final stage that is longer in duration than performed in the prior art. In a particular example the final stage is approximately equal in duration to the initial stage. Alternatively, the final stage is performed so as to polish to depth sufficient to remove scratches created at the inititiation of the final polishing. Scratches initiated at the beginning of the final stage of polishing are removed by the extended length of time of the later stage of polishing.

15 Claims, 1 Drawing Sheet

LOW SCRATCH DENSITY CHEMICAL MECHANICAL PLANARIZATION PROCESS

CROSS-REFERENCE TO RELATED APPLICATIONS

This application is a continuation of application Ser. No. 08/474,311, filed on Jun. 7, 1995, now abandoned.

STATEMENT OF GOVERNMENT INTEREST

This invention was made with Government support under Contract No. MDA972-92-C-0054 awarded by Advanced Research Projects Agency (ARPA). The Government has certain rights in this invention.

BACKGROUND OF THE INVENTION

1. Field of the Invention

The present invention relates, in general, to integrated circuit planarization processes, and, more particularly, to a chemical mechanical planarization (CMP) process for semiconductor wafers that provides reduced scratch density.

2. Statement of the Problem

Integrated circuits are manufactured by stacking multiple layers of metal, semiconductor, and dielectric materials on a top surface of a semiconductor substrate. Each of these layers may be patterned to create complex microelectronic circuitry. Planarization of each of the layers is an important limitation to the number of layers used to form the integrated circuit devices. Non-planar layers are difficult to pattern using conventional photo resist techniques because the focal length varies across the surface of the semiconductor wafer. It is also difficult to form subsequent films on top of a non-planar layer resulting in voids in the subsequent layer. Also, non-planar layers are difficult to completely remove during an etch process. A number of planarization processes have been developed and include chemical mechanical planarization (CMP).

The CMP process involves holding a thin wafer of semiconductor material against a rotating wetted polish pad surface under a controlled downward pressure. A polishing slurry such as a mixture of either a basic or acidic solution is used as a chemical etch component in combination with an abrasive material such as alumina or silica particles. A rotating polishing head or wafer carrier is typically used to hold the wafer under controlled pressure against a rotating polishing platen. The polishing platen is typically covered with a relatively soft, porous wetted pad material such as blown polyurethane.

Removal rate during a CMP process is controlled by the pressure applied, composition of the polishing slurry, and density of the polishing pad. Hard polishing pads remove material from the semiconductor wafer at a higher rate. Softer pads, in contrast, remove material at a slower rate. Similarly, the slurry composition, applied pressure, and rotational speed of the platen can be varied in known ways to control the removal rate.

CMP processes are typically carried out in more than one stage to maximize removal rate while at the same time providing an upper surface with low scratch density. CMP conditions that tend to have high removal rates, also tend to leave the polished surface in a degraded condition. CMP conditions with lower removal rates tend to provide good surface condition, but are not cost effective alternatives because of the long process time. The prior art has addressed this problem by providing two-stage polishing processes whereby the bulk of material is removed during a first stage with a high polishing rate. A second stage follows the first stage with a much slower polishing rate to improve the surface condition with little removal of material from the surface of the integrated circuit. Typically the initial stage is much longer in duration than is the second stage.

It has been found, however, that although the purpose of the second stage of the CMP process is to improve surface condition, it actually degrades surface condition by some standards. While surface roughness may be improved by the slow rate polishing stage, scratch density actually increases using the conventional short polishing cycle. What is needed is a CMP process providing high average removal rate, and good surface condition of the polished surface with low scratch density.

SUMMARY OF THE INVENTION

Briefly stated, the present invention involves a CMP process using two or more stages wherein each stage has a different polishing rate. The CMP process of the present invention is characterized by a final stage that is longer in duration than performed in the prior art. In a particular example the final stage is approximately equal in duration to the initial stage. Scratches initiated at the beginning of the final stage of polishing are removed by the extended length of time of the later stage of polishing.

DETAILED DESCRIPTION OF THE DRAWING

1. Overview

The present invention involves a chemical mechanical planarization (CMP) process comprising two or more polishing stages. The stages are sequenced so that earlier stages have a higher removal rate than later stages. Equipment modifications and polishing parameters for conventional CMP processes are not substantially affected except for the change in the relative duration of each of the stages making up the entire CMP process.

2. Initial Polishing Stage

Figure 2:
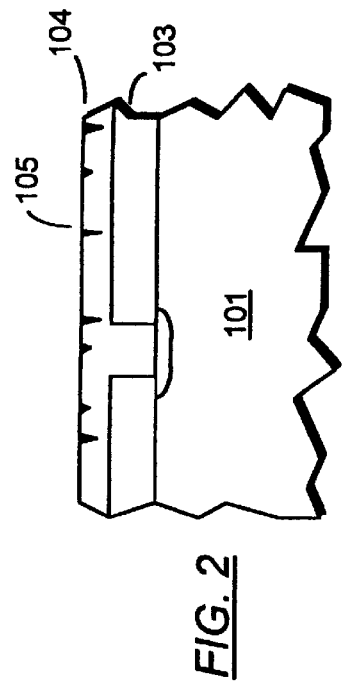
FIG. 2 illustrates in cross-section the semiconductor structure of FIG. 1 at an initial stage of chemical mechanical polishing.
Figure 1:
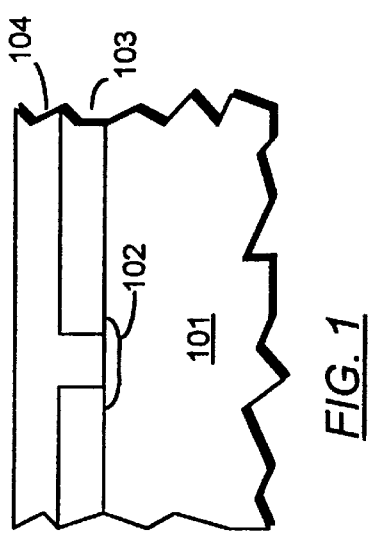
FIG. 1 illustrates a simplified integrated circuit structure before chemical mechanical polishing.
Figure 3:
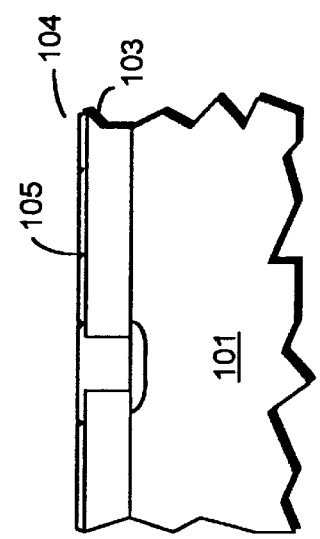
FIG. 3 illustrates in the integrated circuit structure of FIG. 2 at completion of the first stage of polishing in accordance with the present invention.

FIG. 1–FIG. 3 represent a simplified integrated circuit wafer during an initial polishing stage of CMP processing in accordance with the present invention. Semiconductor substrate 101 has a plurality of device structures such as diffused region 102 formed therein. An insulating layer 103 is formed on the surface of substrate 101 and patterned to expose the underlying structure 102. Dielectric layer 103 comprises silicon dioxide, silicon nitride, or the like. Conductive layer 104, comprising a metal or semiconductor material, is formed to cover insulating layer 103 and fill the gap pattern in insulating layer 103 to contact device structure 102.

Semiconductor substrate 101 comprises any type of semiconductor material including silicon, gallium arsenide, germanium, or the like. Complex substrates such as silicon on glass or silicon on sapphire may also be used in accordance with the present invention. Insulating layer 103 and conductive layer 104 are simply illustrations of layers that may be formed on substrate 101. It is expressly understood that multiple layers are typically formed and patterned on the upper surface of substrate 101. Each of these layers in a typical integrated circuit structure can make use of the teachings of the present invention.

In a typical application of a chemical mechanical polishing process, conductive layer 104 must be removed entirely from the upper surface of dielectric 103 while leaving the portion filling the gap or via patterned in dielectric layer 103 intact. Other applications of the CMP process are known, and are equally able to use the teachings of the present invention. It is to be expressly understood that the via formation process illustrated in the preferred embodiment is exemplary only and not a limitation of the present invention.

FIG. 2 illustrates the beginning of the initial polishing stage of the CMP process in accordance with the present invention. The initial polishing stage is characterized in that it has a higher removal or polishing rate than the final polishing stage discussed below. The higher polishing rate is provided by using a harder polishing pad or otherwise controlling the CMP parameters to provide the desired polishing rate.

In the polishing process, a slurry is applied before the polishing begins between conductive layer 104 and the polishing pad. It can be seen that a plurality of scratches 105 are formed in the upper surface of metal layer 104. Scratches 105 are caused, in part, by a high friction between the polishing pad and the upper surface of conductive layer 104.

It will be recalled that this first stage has a relatively high removal rate in order to quickly and efficiently remove the bulk of metal layer 104. Typically, this first stage will continue for approximately 3 minutes resulting in a structure as shown in FIG. 3. As the initial polishing stage continues, the slurry is distributed across the upper surface of conductive layer 104 so as to reduce friction, resulting in a reduction in new scratches and a removal of initial scratches 105. A small portion of metal layer 104 remains, and scratches 105 are still evident. However, it has been found that during the continued polishing, even with a high removal rate, the scratch density of scratches 105 lowers over the duration of the first stage polish.

Figure 4:
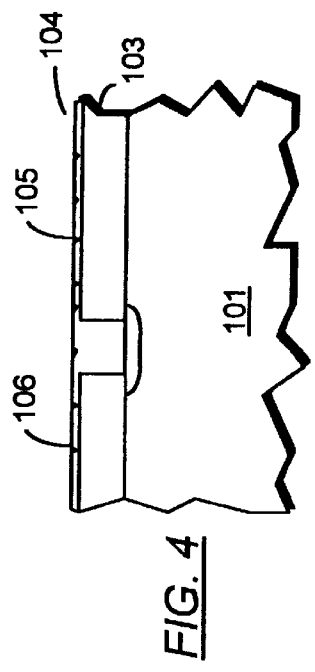
FIG. 4 illustrates the integrated circuit structure of FIG. 3 the beginning of the second stage polishing in accordance with the present invention.
Figure 5:
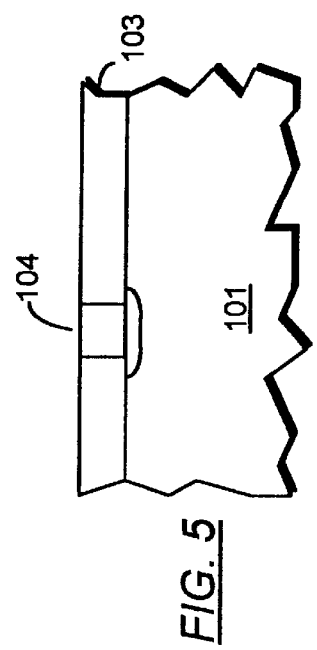
FIG. 5 illustrates the integrated circuit structure of FIG. 4 at completion of the second stage in accordance with the present invention.

As in conventional multi-stage CMP processes, the second or final polishing stage, illustrated in FIG. 4 and FIG. 5, is carried out with a lower removal rate process, usually by changing to a polisher with a softer polishing pad. The intent of the lower removal rate process is to remove the remaining portion of metal layer 104 (shown in FIG. 3 and FIG. 4). Another desirable feature of the second stage polish is to remove or minimize the presence of scratches 105.

Alternatively, the second stage polish may be part of a rework process cycle when it is found that the initial polishing stage removed insufficient material, for example. In this case, the second stage may or may not have a lower removal rate. The teachings of the present invention are equally applicable to the rework cycle in which case the rework polish or polishes are considered equivalent to the second stage polish described herein. The present invention ecompasses the rework cycle type polishing.

As shown in FIG. 4, it has been discovered that the initial phase of the second stage CMP process results in increased scratches 106 when the second stage polishing pad first begins to work on the surface of conductive layer 104. This is probably due to the friction between the polishing pad and surface layer 104 before the slurry has fully distributed between surface layer 104 and the polishing pad. In conventional multi-stage CMP processes, the final stage was relatively short in order to increase average removal rate for the combination of the first and second stages. However, the short second stage resulted in scratches 106 remaining on the surface.

In accordance with the present invention, the duration of the second stage etch is extended to be substantially the same length as the first stage. For example, when the initial stage is three minutes, the final polishing stage should be extended to approximately three minutes. Preferably, the depth removed by the second stage etch is approximately two times the maximum scratch depth created by the initiation of the final polishing. It is acceptable to extend the second stage to within +/−50% of the duration of the initial stage polish. Alternatively, where the final polish stage is extended beyond two minutes, many of the benefits of the present invention will be realized.

The extended duration final polish stage results in a structure shown in FIG. 5 wherein both scratches 105 and scratches 106 are removed from the upper surface of dielectric 103 leaving metal plug 104 filling the patterned gap in dielectric layer 103. Although FIG. 5 illustrates scratches that are entirely removed, it is understood that at some level scratches will always exist in a polished surface. It is intended only that the scratch density after the final stage polish be reduced as compared to the scratch density at the completion of the first or initial polishing stage.

It is to be expressly understood that the claimed invention is not to be limited to the description of the preferred embodiment but encompasses other modifications and alterations within the scope and spirit of the inventive concept.

What is claimed is:

1. A chemical mechanical planarization (CMP) process comprising the steps of:

providing a substrate having one or more layers to be polished;

initially polishing the one or more layers at a first polishing rate for a first period of time; and finally polishing the one or more layers at a second polishing rate, which is different from the first polishing rate, for a second period of time wherein the first period of time is approximately three minutes and the second period of time is greater than two minutes.

2. A chemical mechanical planarization (CMP) process comprising the steps of:

providing a substrate having one or more layers to be polished;

initially polishing the one or more layers at a first polishing rate for a first period of time wherein the step of initially polishing results in an intermediate scratch density on the one or more layers; and finally polishing the one or more layers at a second polishing rate, wherein said second polishing rate is different from said first polishing rate, for a second period of time wherein the second period is more than 50% of the first period of time, wherein the second period of time is chosen to reduce the scratch density on the one or more layers below the intermediate scratch density.

3. A method for polishing a semiconductor substrate having an upper surface to be planarized, the method comprising the steps of:

moving the substrate into contact with a first polishing pad thereby creating an initial scratch density on the upper surface;

initially polishing the substrate with the first polishing pad by rotating the first polishing pad, wherein the initial polishing reduces the scratch density to an intermediate level;

moving the substrate into contact with a second polishing pad thereby increasing the scratch density above the intermediate level; and finally polishing the substrate to completely remove the surface to be planarized and reduce the scratch density below the intermediate level wherein duration of the step of finally polishing is more than 50% of the duration of the step of initially polishing.

4. The method of claim 3 further comprising the steps of:

applying a slurry between the second polishing pad and the substrate before the step of moving the substrate into contact with the second polishing pad; and distributing the slurry between the second polishing pad and the substrate during the step of finally polishing so as to reduce friction between the second polishing pad and the substrate.

5. A chemical mechanical planarization (CMP) process comprising the steps of:

providing a substrate having an upper surface to be polished;

initially polishing the upper surface during a first polishing step;

ceasing said first polishing step;

finally polishing the upper surface during a second polishing step to a depth sufficient to remove scratches created at the initiation of the final polishing, wherein the depth removed is approximately two times the maximum scratch depth created by the initiation of the final polishing.

6. A method of polishing a semiconductor substrate comprising the steps of:

(a) providing a substrate having at least one layer to be polished;

(b) initially polishing said at least one layer at a first polishing rate for a first period of time; and (c) finally polishing said at least one layer at a second polishing rate for a second period of time, said second polishing rate being lower than said first polishing rate, and said second period of time being at least two-thirds as long as said first period of time.

7. The method, as set forth in claim 6, wherein step (b) comprises the step of using a first polishing pad having a first hardness.

8. The method, as set forth in claim 7, wherein step (c) comprises the step of using a second polishing pad having a second hardness, said first hardness being harder than said second hardness.

9. The method, as set forth in claim 6, wherein said first period of time is substantially equal to said second period of time.

10. The method, as set forth in claim 6, wherein said first period of time is at least three minutes and wherein said second period of time is at least two minutes.

11. A method of polishing a semiconductor substrate comprising the steps of:

(a) providing a substrate having at least one layer to be polished;

(b) initially polishing a surface of said at least one layer at a first polishing rate for a first period of time to remove a first portion of said at least one layer and to produce an first scratch density on said surface; and (c) finally polishing said surface of said at least one layer at a second polishing rate for a second period of time to remove a second portion of said at least one layer and to produce a second scratch density on said surface, said second polishing rate being different from said first polishing rate, said second period of time being at least two-thirds as long as said first period of time, and said second scratch density being lower than said first scratch density.

12. The method, as set forth in claim 11, wherein step (b) comprises the step of using a first polishing pad having a first hardness.

13. The method, as set forth in claim 12, wherein step (c) comprises the step of using a second polishing pad having a second hardness, said first hardness being harder than said second hardness.

14. The method, as set forth in claim 11, wherein said first period of time is substantially equal to said second period of time.

15. The method, as set forth in claim 11, wherein said first period of time is at least three minutes and wherein said second period of time is at least two minutes.

* * * * *